(12) United States Patent
Wu et al.

(10) Patent No.: US 10,427,185 B2
(45) Date of Patent: Oct. 1, 2019

(54) PATTERNING METHOD

(71) Applicant: Semiconductor Manufacturing International (Shanghai) Corporation, Shanghai (CN)

(72) Inventors: Qiang Wu, Shanghai (CN); Huayong Hu, Shanghai (CN); Chang Liu, Shanghai (CN); Jianhua Ju, Shanghai (CN); Charles Kwok Fung Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 226 days.

(21) Appl. No.: 15/372,091

(22) Filed: Dec. 7, 2016

(65) Prior Publication Data

US 2017/0080456 A1 Mar. 23, 2017

Related U.S. Application Data

(62) Division of application No. 14/568,317, filed on Dec. 12, 2014, now Pat. No. 9,547,236.

(30) Foreign Application Priority Data

Jan. 20, 2014 (CN) .......................... 2014 1 0025114

(51) Int. Cl.
*B05D 3/06* (2006.01)
*B05B 7/22* (2006.01)
*B41J 2/447* (2006.01)
*G03F 7/00* (2006.01)
*B05D 1/02* (2006.01)

(52) U.S. Cl.
CPC ................. *B05D 3/06* (2013.01); *B05B 7/228* (2013.01); *B05D 1/02* (2013.01); *B41J 2/447* (2013.01); *G03F 7/0002* (2013.01)

(58) Field of Classification Search
CPC ............. B41J 2/447; B05D 3/06; B05B 7/228
See application file for complete search history.

(56) References Cited

U.S. PATENT DOCUMENTS

| | | | |
|---|---|---|---|
| 2002/0018100 A1 | 2/2002 | Katoh | |
| 2003/0142167 A1* | 7/2003 | Nakamura | H05B 33/10 347/37 |
| 2004/0226929 A1* | 11/2004 | Miura | B41M 3/006 219/121.85 |
| 2007/0002108 A1* | 1/2007 | Sugahara | B41J 2/14233 347/92 |

* cited by examiner

*Primary Examiner* — Dah-Wei D. Yuan
*Assistant Examiner* — Stephen A Kitt
(74) *Attorney, Agent, or Firm* — Anova Law Group, PLLC

(57) ABSTRACT

A patterning apparatus is provided. The patterning apparatus includes a plurality of liquid jet units arranged in one or more groups and configured to jet an anti-etching liquid onto a surface of a substrate. The patterning apparatus also includes a plurality of exposure units configured to expose light on the anti-etching liquid jetted on the surface of the substrate to heat and cure the jetted anti-etching liquid to form anti-etching patterns on the surface of the substrate. Further, the patterning apparatus includes a control unit configured to control motion status and jetting status of the plurality of liquid jet units and motion status and exposure status of the plurality of exposure units, so as to form the anti-etching patterns at a predetermined line width and thickness.

18 Claims, 8 Drawing Sheets

PATTERNING METHOD

CROSS-REFERENCES TO RELATED APPLICATIONS

This application is a divisional of U.S. patent application Ser. No. 14/568,317, filed on Dec. 12, 2014, which claims the priority of Chinese patent application No. 201410025114.1, filed on Jan. 20, 2014, the entirety of all of which is incorporated herein by reference.

FIELD OF THE INVENTION

The present invention generally relates to the field of semiconductor technology and, more particularly, relates to patterning apparatus and patterning methods thereof.

BACKGROUND

During the development of the integrated circuit (IC) fabrication technology, photolithography process has always been a major process for fabricating semiconductor patterns. For a photolithography process, various patterns on a photolithographic mask are sequentially projected on a substrate coated with a photoresist layer with a precise alignment by an exposure apparatus. After a developing process, the designed patterns are formed on the substrate.

With the continuous shrinkage of the critical dimension (CD) of the semiconductor technology, the cost of the optical exposure apparatus and the high resolution mask has become a major limitation for the development of the semiconductor technology. Currently, the cost of the exposure process and related cost of the semiconductor manufacture is in a range of approximately 35%~40% of the total cost of the semiconductor manufacturing. When the substrate with diameter of 450 mm is introduced, the cost of the exposure apparatus may be increased in a range of approximately 50%~60% of the total cost of the semiconductor manufacture.

Some processes have been developed to substitute the photolithography process, such as the multiple e-beam lithography technology, or the nano-imprinting technology, etc. However, the multiple e-beam lithography technology is more expensive; and its throughput is slow due to limited electron current that can be used with electron guns. The nano-imprinting technology is limited by the high defect density (~50-100 times more than the photolithography method).

Therefore, a low-cost patterning apparatus and patterning method is of demand. The disclosed apparatus and method are directed to solve one or more problems set forth above and other problems.

BRIEF SUMMARY OF THE DISCLOSURE

One aspect of the present disclosure includes a patterning apparatus. The patterning apparatus includes a plurality of liquid jet units arranged in one or more groups and configured to jet an anti-etching liquid onto a surface of a substrate. The patterning apparatus also includes a plurality of exposure units configured to expose light on the anti-etching liquid jetted on the surface of the substrate to heat and cure the jetted anti-etching liquid to form anti-etching patterns on the surface of the substrate. Further, the patterning apparatus includes a control unit configured to control motion status and jetting status of the plurality of liquid jet units and motion status and exposure status of the plurality of exposure units, so as to form the anti-etching patterns at a predetermined line width and thickness.

Another aspect of the present disclosure includes a patterning method for a patterning apparatus having a plurality of liquid jet units arranged in columns and groups and a plurality of exposure units corresponding to the plurality of liquid jet units. The method includes providing a substrate. The method includes jetting an anti-etching liquid onto a surface of the substrate by the plurality of liquid jet units along a scanning direction. Further, the method includes exposing light on the anti-etching liquid jetted on the surface of the substrate to heat and cure the jetted anti-etching liquid to form anti-etching patterns on the surface of the substrate by the plurality of exposure units along the scanning direction. The method also includes controlling motion status and jetting status of the plurality of liquid jet units and controlling motion status and exposure status of the plurality of exposure units, so as to form the anti-etching patterns at a predetermined line width and thickness.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

During the manufacturing of semiconductor patterns, especially the manufacturing of fin field effect transistor (FinFET), it may need a large quantity of regular patterns, such as lines/spaces, and/or regular space holes, etc. These regular patterns may only contain a relative small amount of spatial information, such as line width, pitch, length of pattern array and width of pattern array. Thus, it may be a waste for using the photolithography process to form such regular patterns, and finding a more cost-effective way in substrate patterning will be necessary to support the sustainable growth of the economy of the semiconductor manufacturing industry.

Further, the liquid jet technology may be able to obtain a relatively high resolution, for example, the resolution of the liquid jet technology may be approximately of 9600 dpi the non-scanning direction, which is equivalent to a 2.6 um pitch with a 1.3 um dot size; and much higher than the resolution of most camera lenses with a resolution in a range of approximately 5 μm-20 um. In a photolithography process, the resist or anti-reflection layer material may be filtered through a 5 nm pore size filter, which means that the photoresist may penetrate through nanoscopic openings with no issues. Therefore, the cost issue of the semiconductor manufacture may be overcome by a patterning apparatus and a patterning method based on the liquid jet technology.

Figure 1:
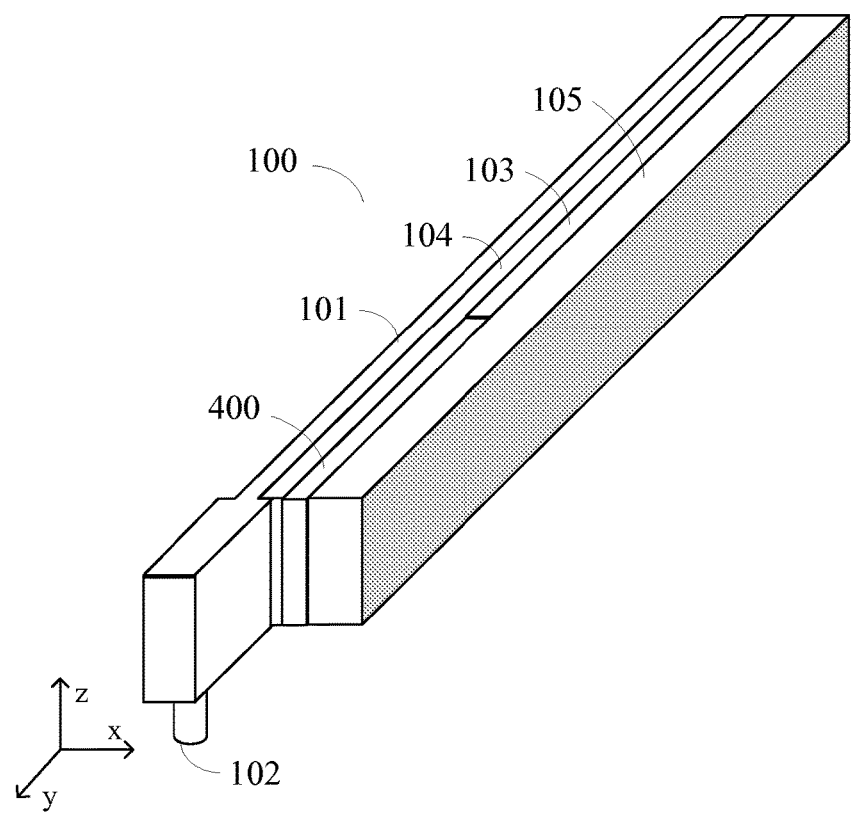
FIG. 1 illustrates the three-dimensional view of a liquid jet unit consistent with the disclosed embodiments.

The patterning apparatus may include one or more liquid jet units and one or more exposure units. FIG. 1 illustrates a three-dimensional view a liquid jet unit consistent with the disclosed embodiments. As shown in FIG. 1, the liquid jet unit 100 may include an anti-etching liquid unit cell 101, a jet nozzle 102, a compression unit 103, a first electrode 104 and a second electrode 105.

The anti-etching liquid cell 101 may be configured to hold an anti-etching liquid. Further, the anti-etching liquid cell 101 may connect with the jet nozzle 102; and provide an anti-etching liquid source. The anti-etching liquid may be cured by an infrared light to form anti-etching patterns on a substrate. The patterns may be used as an etching mask and may not be etched by a subsequent etching process, thus the patterns may be referred as anti-etching patterns.

The anti-etching liquid may be any appropriate etching barrier material, such as a bottom antireflection material, or a photoresist material, etc. In certain other embodiments, the anti-etching material may be other non-photoactive photoresist, etc.

The jet nozzle 102 may be any appropriate shape. In one embodiment, the jet nozzle 102 is a cylindrical tube. The size (inner diameter) of the cylindrical tube may be in a range of approximately 80%~120% of the line width of the anti-etching patterns.

The compression unit 103 may be configured to compress the liquid cell 101 to cause the anti-etching liquid in the anti-etching liquid cell 101 to be jetted from the jet nozzle 102. Further, referring to FIG. 1, the first electrode 104 and the second electrode 105 may be disposed at both sides of the compression unit 103. By applying a voltage between the first electrode 104 and the second electrode 105, the compressive status and the release status of the compression unit 103 may be controlled.

The compression unit 103 may be made of any appropriate material. In one embodiment, the compression unit 103 may be made of a piezoelectric material, or an electrical thermal material, thus the compression unit 130 may be driven by an electric signal directly. In certain other embodiments, the compression unit 103 may be made other non-active material, thus the compression unit 103 may be constructed as a MEMS device, and driven by an electric static force, or a magnetic force, etc.

The first electrode 104 and the second electrode 105 may be made of any appropriate material, such as metal film, conductive paste, or polysilicon, etc. In one embodiment, the first electrode 104 and the second electrode 105 are made of polysilicon.

Further, referring to FIG. 1, an insulation layer 400 may be formed between the first electrode 104 and the second electrode 105. The insulation layer 400 may be used to electrically and physically insulate the first electrode 104 and the second electrode 105. Various materials may be used as the insulation layer 400, such as silicon oxide, silicon nitride, or rubber, etc.

Further, referring to FIG. 1, the length of the anti-etching liquid cell 101 (along the y-axis direction) and the length of the first electrode 104 and the second electrode 105 (along y-axis direction) may be any appropriate value. In one embodiment, the length of the anti-etching liquid cell 101 may be greater than the length of the first electrode 104 and the second electrode 105. Thus, the anti-etching liquid cell 101 may protrude from the entire liquid jet unit 100; and the jet nozzle 102 may be disposed at the protruding portion of the anti-etching liquid cell 101.

In one embodiment, the width of the anti-etching liquid cell 101 (along the x-axis direction) may be approximately 50 nm. The inner diameter of the jet nozzle 102 may be approximately 50 nm. The thickness of the compression unit 103 (along the x-axis direction) may be approximately 50 nm. The thickness of the first electrode 104 (along the x-axis direction) may be approximately 50 nm. The thickness of the second electrode 105 may be approximately 150 nm. In certain other embodiments, other appropriate geometric design may be used.

Figure 2:
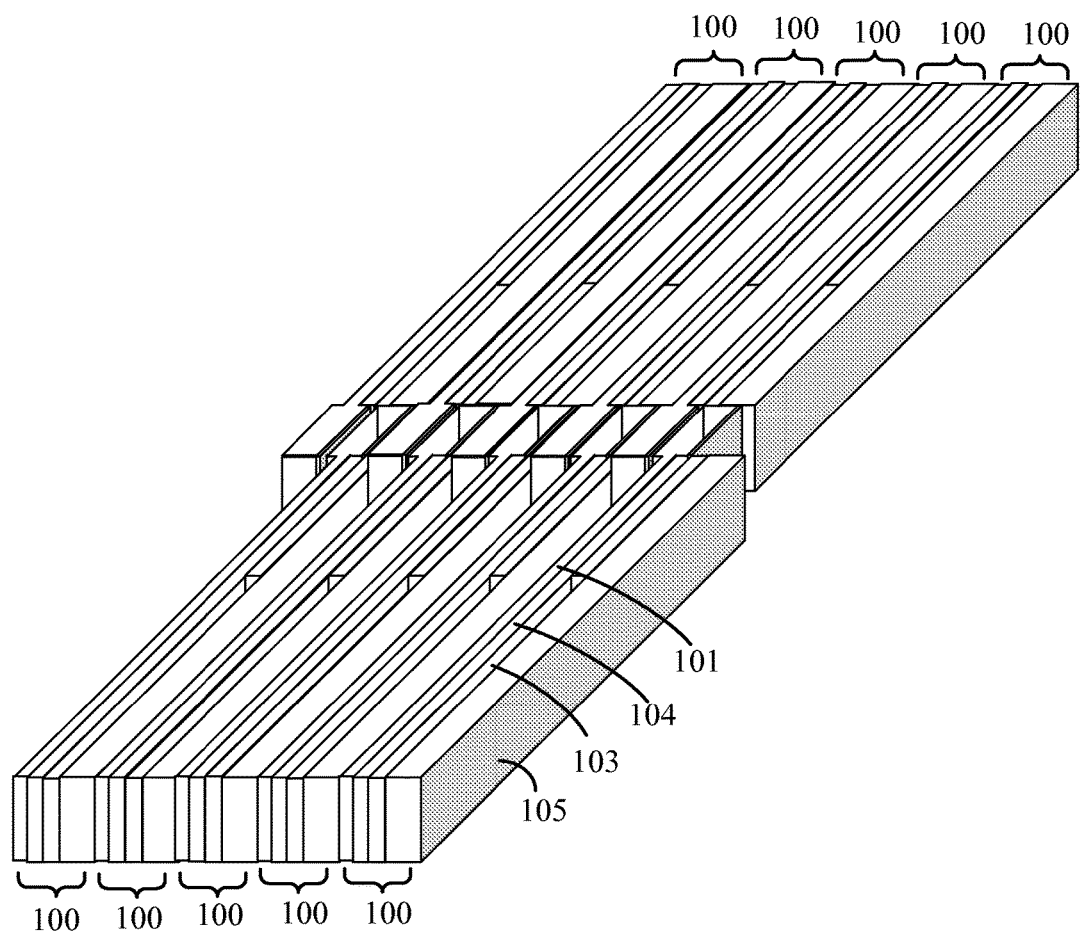
FIG. 2 illustrates the three-dimensional view of a plurality of liquid jet units aligned in a column consistent with the disclosed embodiments.
Figure 3:
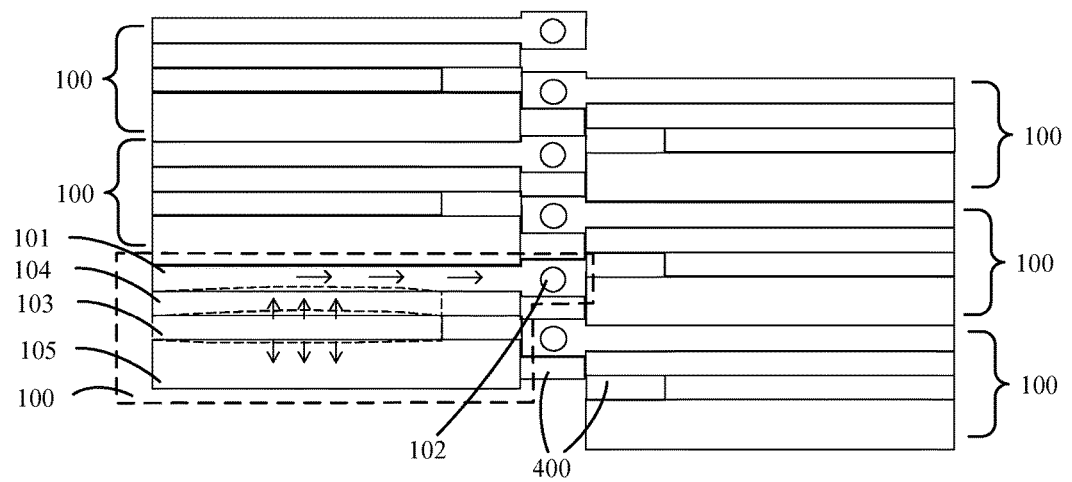
FIG. 3 illustrates a top view of a plurality of liquid jet units consistent with the disclosed embodiments.

FIGS. 2~3 illustrate a plurality of liquid jet units 100. The jet nozzles 102 of the plurality of liquid jet units 100 are aligned into a column. FIG. 3 is a top view of the plurality of the jet units 100 illustrated in FIG. 2.

As shown in FIGS. 2~3, because the thickness of the anti-etching liquid cell 101 (along the x-axis direction shown in FIG. 1) is smaller than the total thickness of the liquid jet unit 100 (along the x-axis shown in FIG. 1), and the jet nozzle 102 may be disposed at the protruding portion of the anti-etching liquid cell 101, the plurality of the liquid jet units 100 may be aligned into a column at both sides the central line of the jet nozzles 102 (along the x-axis shown in FIG. 1). The gap between jet nozzles 102 may be filled with the insulation layer 400. Such an alignment of the jet nozzles 102 and the liquid jet units 100 may increase the alignment density of the jet nozzles 102, and it may increase the pattern density of the subsequently formed anti-etching patterns.

Further, referring to FIG. 3, the first electrode 104 may be adjacent to the anti-etching liquid cell 101; and the thickness of the first electrode 104 may be smaller than the thickness of the second electrode 105. When a voltage is applied between the first electrode 104 and the second electrode 105, the piezoelectric material (the compression unit 103) between the first electrode 104 and the second electrode 105 may generate a deformation; and the deformation may press the first electrode 104 and the second electrode 105. Further, the thickness of the first electrode 104 may be smaller than the second electrode 105. For example, the thickness of the first electrode 104 may be approximately one third of the thickness of the second electrode 105. Therefore, the deformation of the first electrode 104 may be significantly greater than the deformation of the second electrode 105. The deformed first electrode 104 may further press the anti-etching liquid cell 101, and thus the anti-etching liquid in the anti-etching liquid cell 101 may be jetted from the liquid jet unit 100 through the jet nozzle 100.

Figure 4:
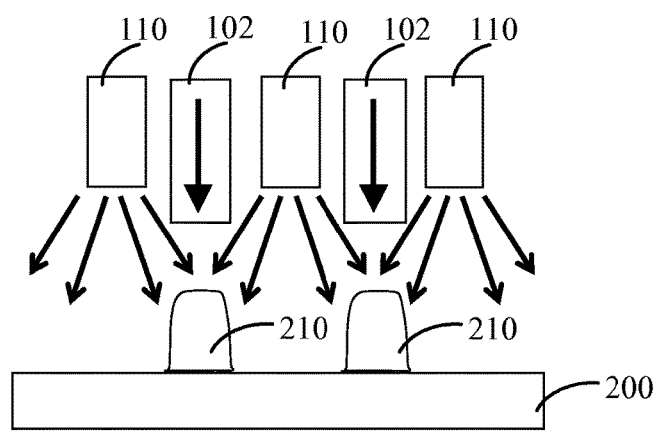
FIG. 4 illustrates the principle of the exposure unit irradiating the anti-etching liquid consistent with the disclosed embodiments.

Further, as shown in FIG. 4, a plurality of exposure units 110 may be disposed at both sides of the jet nozzle 102. FIG. 4 also illustrates the principle for forming a plurality of the anti-etching patterns 210 on the surface of a substrate 200.

When the anti-etching liquid stored in the anti-etching liquid cell 101 is jetted out from the jet nozzle 102; and deposited on the surface of the substrate 200, the light generated by the exposure units 110 may irradiate and heat the anti-etching liquid deposited on the surface of the substrate 200 immediately, thus the anti-etching liquid may be cured to form the anti-etching patterns 210.

The light generated by the exposure units 110 may be an infrared light or an ultraviolet light, etc. In one embodiment, the light generated by the exposure unit 110 is an infrared light. The infrared light may have a higher heating efficiency.

In one embodiment, the inner diameter of the jet nozzle 102 may be approximately 50 nm; the maximum jet length may be approximately 400 nm and the area of the side surface of the compression unit 103 may be approximately 100 μm×150 nm. Thus, the area of the side surface of the compression unit 103 may approximately 6000 times of the area of the jet nozzle 102. That is, for a same volume, the side surface of the compression unit 103 may only need to move 0.07 nm to cause the jet nozzle 102 to have a jet length of 400 nm. Usually, the swelling ratio of piezoelectric ceramic, i.e., the ratio of the sizes before and after a deformation, may be approximately 0.2%, thus if the compression unit 103 is made of piezoelectric ceramic, the swelling value of the compression unit 103 made of the piezoelectric ceramic may be approximately 0.1 nm; and such a swelling value may cause the jet nozzle 102 to have a maximum jet length up to 400 nm. For a patterning process with a resolution of 50 nm, the thickness of the photoresist may be approximately 100 nm; the jet length of 400 nm of the disclosed patterning apparatus may be able to match the process requirements.

Further, the line width of the subsequently formed anti-etching patterns 210 on the surface of the substrate 200 may be controlled by the quantity of the anti-etching liquid jetted through the jet nozzle 102. The quantity of the anti-etching liquid may be controlled by the size of the jet nozzle 102, the area of the sidewall of the anti-etching liquid cell 101, and the area of the sidewall of the compression unit 103, etc.

Figure 9:
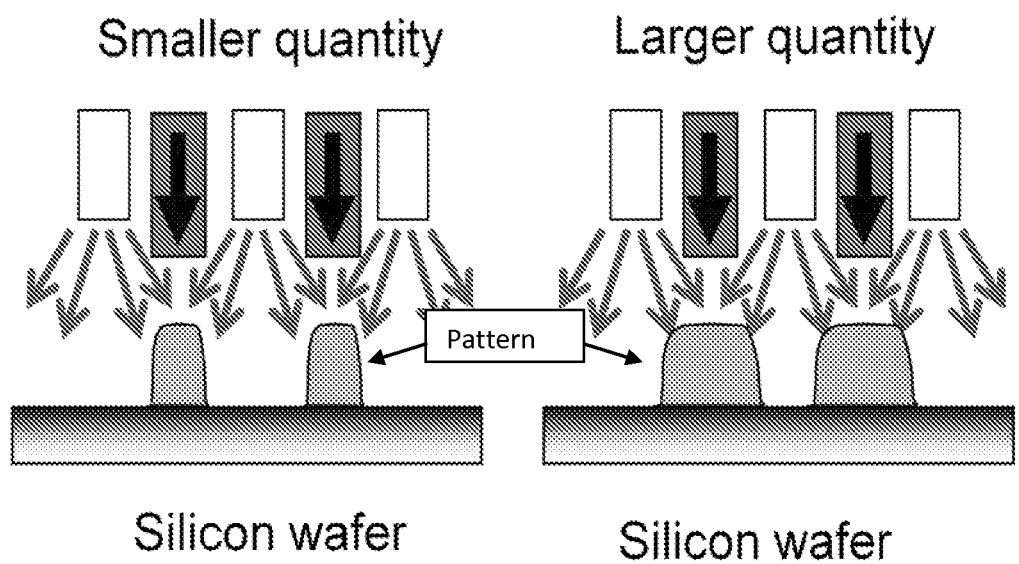
FIG. 9 illustrates a controlling of the line width of the anti-etching patterns by the quantity of the anti-etching liquid consistent with the disclosed embodiments.

Further, the thickness of the anti-etching patterns 210 formed on the surface of the substrate 200 may be controlled by the quantity of the anti-etching liquid jetted by the jet nozzle 102 and/or by using an anti-etching liquid having different surface tension. The anti-etching liquid having a relatively large surface tension may form relatively thick anti-etching patterns 210 on the surface of the substrate 200. The anti-etching liquid having a relatively small surface tension may be form relatively thin anti-etching patterns 210 on the surface of the substrate 200. Further, as shown in FIG. 9, a larger quantity of anti-etching liquid jetted by jet nozzle 102 may form anti-etching patterns with a larger line width; and a smaller quantity of anti-etching liquid jetted by the jet nozzle 102 may form anti etching patterns with a smaller line width.

Figure 5:
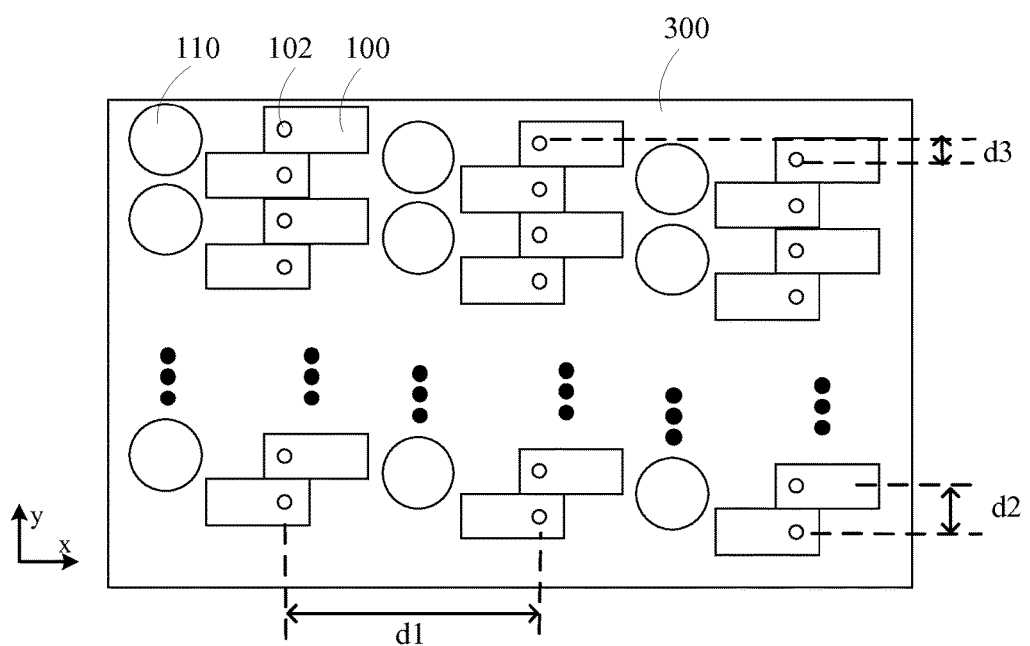
FIG. 5 illustrates a liquid jet group having a plurality of the liquid jet units consistent with the disclosed embodiments.

As shown in FIG. 5, a liquid jet group 300 may be formed by a plurality of liquid jet units 100. The plurality of the liquid jet units 100 may be aligned with columns and rows. The columns may be perpendicular to the jet unit scanning direction, i.e., the x-axis direction. The rows may have a predetermined angle with the scanning direction of the liquid jet units 100. The exposure units 110 may be disposed between adjacent columns.

In one embodiment, referring to FIG. 5, the first periodic distance d1 of the liquid jet units 100 or the jet nozzles 102 along the scanning direction (the x-axis direction) may be in a range of approximately 50 μm~300 μm. The second periodic distance d2 of the liquid jet units 100 or the jet nozzles 102 may be in a range of approximately 300 nm~10000 nm.

Further, referring to FIG. 5, in one embodiment, the liquid jet units 100 in a same row and different columns may have an offset d3 along the scanning direction (x-axis). Such an arrangement may be referred that the rows may have a predetermined angle with the scanning direction of the liquid jet units 100. Such an arrangement may cause the plurality of liquid jet units 100 to obtain anti-etching patterns 210 with a pitch smaller than the second periodic distance d2 of the liquid jet units 100 when the plurality of the liquid jet units 100 jet the anti-etching liquid along the scanning direction to form the anti-etching patterns 210.

The column number of the liquid jet group 300 may be determined by the pitch of the anti-etching patterns 210. In one embodiment, if the liquid jet units 100 of the liquid jet group 300 are arranged as illustrated in FIG. 2 or FIG. 3, when the width of the anti-etching liquid cell 101 is approximately 50 nm; the thickness of the compression unit 103 is approximately 50 nm; the width of the first electrode 104 is approximately 50 nm; and the second electrode 105 is approximately 250, the spatial period of the jet nozzles 102 along the direction vertical to the jet scanning direction may be approximately 200 nm. If the line width of the to-be-formed anti-etching patterns is approximately 50 nm, the pitch is approximately 100 nm, thus anti-etching patterns with the pitch size 100 nm may be obtained by using two columns of liquid jet units 100 with a spatial period of 200 nm and an interval d3=100 nm along the direction vertical to the jet scanning direction to jet-scan simultaneously. In certain other embodiments, when the spatial period of the jet nozzles 102 along the direction vertical to the jet-scan direction is approximately 200 nm, and the pitch of the to-be-formed anti-etching patterns are smaller than 100 nm, a plurality of columns of the liquid jet unit 100 may be used to obtain the anti-etching patterns.

Further, referring to FIG. 5, a plurality of the exposure units 110 may be disposed between columns vertical to the jet-scan direction. Because the second distance d2 between adjacent liquid jet units 100 along the direction vertical to the jet-scan direction may determine the line width of the subsequently formed anti-etching patterns; and the first distance d1 between adjacent liquid jet units 100 along the a direction parallel to the jet-scan direction may be relatively large, when the plurality of exposure units 110 are disposed between the columns along the direction vertical to the jet-scan direction, it may aid to the printing of patterns at small pitch of the subsequently formed anti-etching patterns.

Further, referring to FIG. 5, the plurality of exposure units 110 may form a plurality of columns vertical to the jet-scan direction; and the columns of the exposure units 110 and the columns of the liquid jet units 100 may be alternatingly-distributed. Such a distribution may cause the anti-etching liquid jetted on the surface of the substrate to be heated immediately after the anti-etching liquid being jetted by any column of liquid jet units 100. Thus, the anti-etching liquid jetted on the surface of the substrate may be cured to form the anti-etching patterns.

Figure 6:
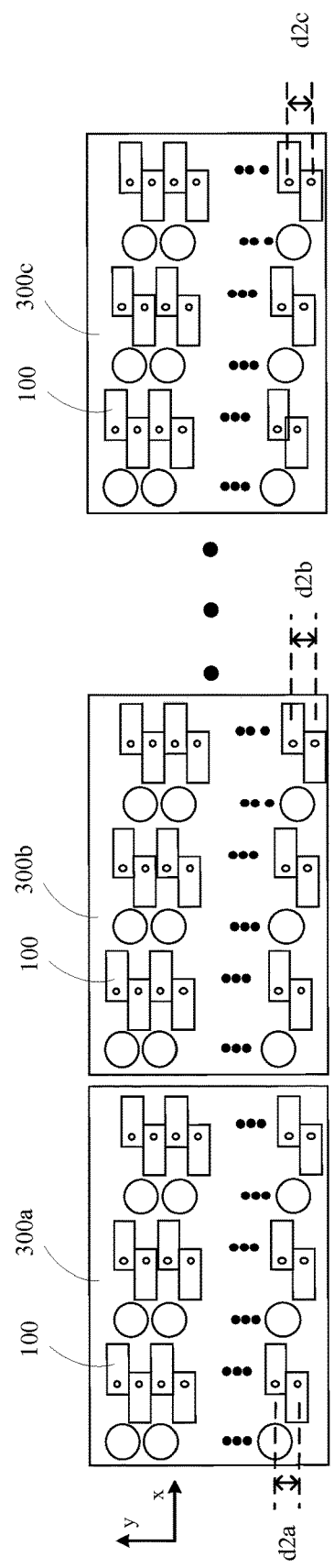
FIG. 6 illustrates a liquid jet module having a plurality of the liquid jet groups consistent with the disclosed embodiments.

In certain other embodiments, a liquid jet module may be formed by a plurality of the liquid jet groups 300. FIG. 6 illustrates a liquid jet module consistent with the disclosed embodiments. For illustrative purposes, three of the plurality of the liquid jet groups 300 are illustrated: the first liquid jet group 300a, the second liquid jet group 300b and the third liquid jet group 300c.

As shown in FIG. 6, the periodic distances d2a, d2b, and d2c of the first liquid jet group 300a, the second liquid jet group 300b and the second liquid jet group 300c along the scan-jet direction (y-axis direction) may be different. That is, the pitch of the liquid jet units 100 along the jet-scan direction may be different, and the magnification ratio of the formed patterns along the non-scanning direction may be different. Thus, the magnification errors caused by the patterning process may be covered by the disclosed liquid jet module. The magnification errors may include the magnification errors caused by the heating process of the patterning process, etc.

In certain other embodiments, it may need an overlay-magnification for the extension caused by heating the substrate during the process for forming the anti-etching patterns. The overlay-magnification may be performed by pre-selecting jet nozzle groups with different pattern magnifications. In one embodiment, the difference of the pattern magnifications of different jet nozzles may be in range of approximately ±0.1 ppm~±1 ppm.

In certain other embodiments, the overlay-magnification along the scanning direction may be performed by adjusting the scanning speed along the scanning direction and the jetting time.

Figure 7:
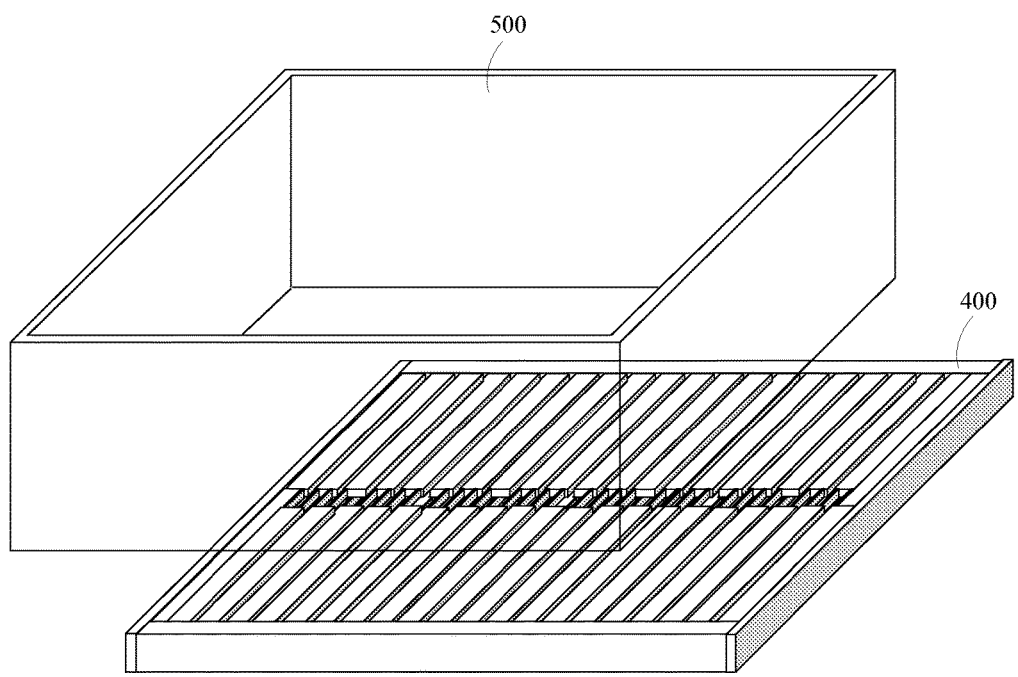
FIG. 7 illustrates insulation layers and an anti-etching liquid pool of an exemplary patterning apparatus consistent with the disclosed embodiments.

Further, the patterning apparatus may also include an insulation layer and an anti-etching liquid reservoir. FIG. 7 illustrates a corresponding structure.

As shown in FIG. 7, an insulation layer 400 and an anti-etching liquid reservoir 500 may be sequentially disposed on a plurality of liquid jet units 100 to form the disclosed patterning apparatus. The insulation layer 400 may be disposed on a plurality of liquid jet units 100 (referring to FIG. 2); and may cover the plurality of liquid jet units 100. The insulation layer 400 may be used to insulate the plurality of liquid jet units 100 and the anti-etching liquid reservoir 500. Further, referring to FIG. 1 and the FIG. 3, as described above, the insulation layer 400 may also be used to fill the gap between the first electrode 104 and the second electrode 105 and the gap between adjacent liquid jet units 100 and jet nozzles 102, etc.

The insulation layer 400 may have a plurality of openings. The openings may be used to connect the anti-etching liquid reservoir 500 and the anti-etching liquid cells 101 of the plurality of liquid jet units 100. When the anti-etching liquid reservoir 500 connects with the plurality of the anti-etching liquid cells 101, the anti-etching liquid reservoir 500 may provide the anti-etching liquid to the anti-etching liquid cells 101.

Further, the exposure apparatus may also include a control module (not shown). The control module may be configured to provide scanning parameters; control the motion status and jetting status of one or more liquid jet units 100, liquid jet groups 300 and/or liquid jet modules, etc. The control module may also be configured to control the motion status and exposure status of one or more exposure units 110. By controlling such status, anti-etching patterns may be formed on the surface of the substrate. In one embodiment, the control unit may be similar as the control unit of an electron beam lithography system or a modified control unit of an electron beam lithography system, etc.

The control module may also control other components of the exposure apparatus. For example, the exposure apparatus may include a plurality of motors. The motors may carry the liquid jet module to scan along the scanning direction. The control module may send commands to the motors to perform a scanning.

The exposure apparatus may also include a plurality of alignment and leveling modules to align the and level the exposure apparatus with the wafer. The control module may used to send and receive signal from the alignment and leveling modules; and perform an alignment and leveling process.

Figure 8:
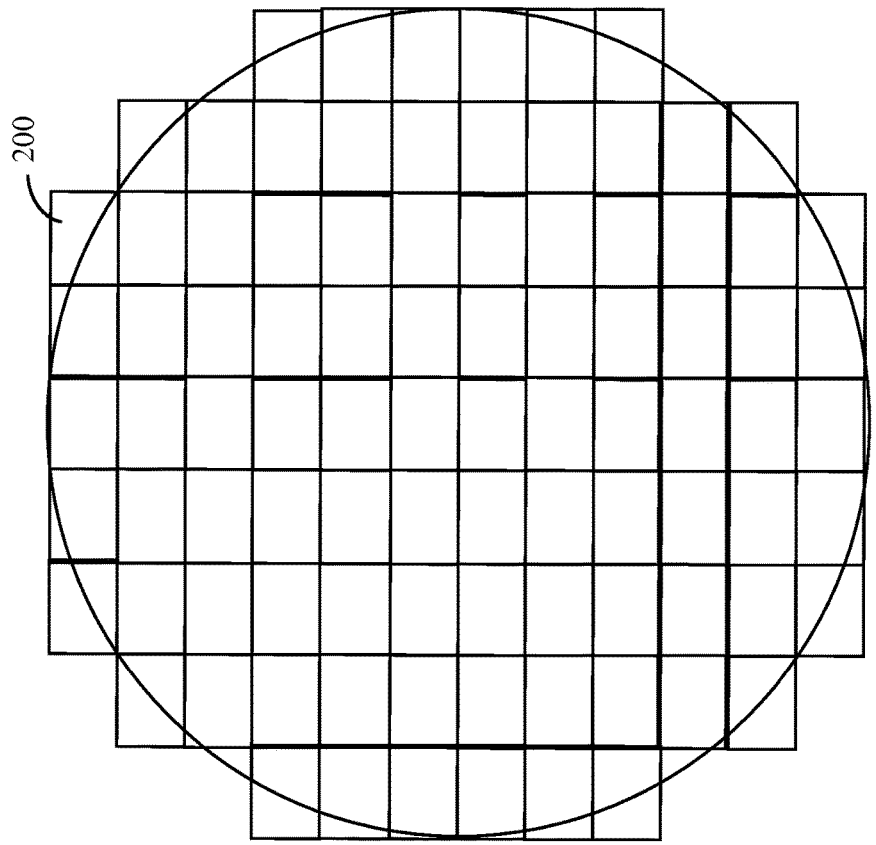
FIG. 8 illustrates the principle of scanning a substrate using a multiple-liquid-jet module consistent with the disclosed embodiments.
Figure 8:
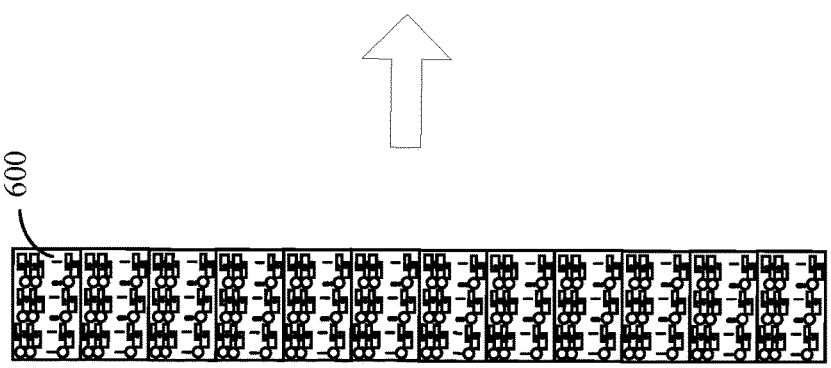

In one embodiment, the patterning apparatus may include a plurality of liquid jet modules. FIG. 8 illustrates a corresponding structure.

As shown in FIG. 8, for a 300 mm substrate 200, there may be 12×9 exposure shots, thus 12 liquid jet modules may be combined into a column along a direction vertical to a scanning direction, thus a multiple-liquid jet module 600 may be constructed. The efficiency for forming anti-etching patterns may be significantly improved by using the multiple-liquid jet module 600. For example, the total exposure time of all the exposure shots on the substrate 200 may be approximately 3 seconds; the yield per hour may be over 300 substrates even considering the substrate loading and alignment. Such a yield is much higher than the yield of an immersion lens lithography system, which is 200 substrates per hour. Further, the disclosed patterning apparatus does not need expensive lenses and reticles, and the liquid jet units 100 may be fabricated by a process similar as the process for forming the nozzle of existing printer, thus the disclosed apparatus may have a significantly high yield with a low cost.

Therefore, the present disclosure also includes a patterning process performed by the disclosed patterning apparatus. The patterning process includes providing a substrate; jetting an anti-etching liquid on the surface of the substrate by one or more liquid jet units along a scanning direction; and exposing and heating to cure the anti-etching liquid jetted on the surface of the substrate by one or more exposures unit along the scanning direction.

By using the disclosed methods and apparatus, various advantageous applications may be implemented. According to the disclosed embodiments, the patterning apparatus may include a plurality of liquid jet units. The liquid jet units may jet an anti-etching liquid onto the surface of a wafer. The patterning apparatus may also include a plurality of exposure units. The exposure units may be configured to irradiate the anti-etching liquid formed on the surface of the wafer to cure the anti-etching liquid formed on the surface of the wafer along the scanning direction to form anti-etching patterns. Further, the patterning apparatus may include a control module. The control module may be configured to control the motion and the jet status of the liquid jet units and the motion and the exposure status of the exposure units. The disclosed patterning apparatus may jet an anti-etching liquid on the surface of a wafer by controlling the liquid jet units; and irradiate the anti-etching liquid formed on the surface of the wafer by controlling the exposure units to cure the anti-etching liquid formed on the surface of the wafer to formed anti-etching patterns. Because the disclosed patterning apparatus does not include expensive lens and reticles, the cost is relatively low.

Further, the disclosed apparatus may be able to form a liquid jet group using a plurality of liquid jet units. The plurality of liquid jet units may be distributed by rows and columns. Further, the rows parallel to the jet scan direction may have an angle with the jet scan direction. That is, the liquid jet units at a same row and different columns may have a certain distance; and may be offset. A plurality of columns of liquid jet units may jet an anti-etching liquid simultaneously; and it may be able to reduce the pitch of the anti-etching patterns formed on the wafer.

Further, the disclosed pattern apparatus may be able to form a liquid jet module using a plurality of liquid jet groups. The periodic distance of a liquid jet group along a direction perpendicular to the scanning direction may be different. That is, the pitch of the liquid jet units of each liquid jet group may be different; and the pattern magnification ratio may be different, thus the overlay-magnification may be performed by selecting jet nozzle groups with different magnification ratios.

Further, the disclosed pattern apparatus may be able to connect multiple liquid jet modules together along the direction perpendicular to the jet scan direction. The pattern apparatus having multiple liquid jet modules may be able to significantly improve the efficiency for forming the anti-etching patterns; and the pattern capability of the pattern apparatus may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A patterning method, comprising:
providing a patterning apparatus having a plurality of liquid jet units arranged in one or more columns and a plurality of exposure units corresponding to the plurality of liquid jet units;
providing a substrate;
jetting anti-etching liquid onto a surface of the substrate by the plurality of liquid jet units along a scanning direction, wherein:
each liquid jet unit includes an anti-etching liquid cell, a jet nozzle connecting with the anti-etching liquid cell, a compression unit, a first electrode and a second electrode,
each jet nozzle corresponds to a single anti-etching liquid cell, and the anti-etching liquid cells are disposed on alternating sides of the consecutive jet nozzles along a central line of the column;
exposing light on the anti-etching liquid jetted on the surface of the substrate to heat and cure the jetted anti-etching liquid to form anti-etching patterns on the surface of the substrate by the plurality of exposure units along the scanning direction; and
controlling motion status and jetting status of the plurality of liquid jet units and controlling motion status and exposure status of the plurality of exposure units, so as to form the anti-etching patterns at a predetermined line width and thickness.

2. The method according to claim 1, wherein:
the anti-etching liquid cell stores the anti-etching liquid;
the jet nozzle jets the anti-etching liquid onto the surface of the substrate;
the compression unit compresses the anti-etching liquid unit to cause the anti-etching liquid in the anti-etching liquid cell to be jetted out from the jet nozzle; and
the first electrode and the second electrode are disposed at both sides of the compression unit to control a compression status of the compression unit by applying a voltage.

3. The method according to claim 1, wherein:
the first electrode and the second electrode are made of polysilicon.

4. The method according to claim 1, wherein:
the first electrode is adjacent to the anti-etching liquid cell.

5. The method according to claim 1, wherein:
the jet nozzle is a cylindrical tube; and
an inner diameter of the jet nozzle is in a range of approximately 80%~120% of a line width of the anti-etching patterns.

6. The method according to claim 1, wherein:
a light source of the exposure unit is an infrared light source.

7. The method according to claim 1, wherein:
the anti-etching liquid is a bottom anti-reflection material; or a photoresist material.

8. The method according to claim 1, further including:
connecting an anti-etching liquid reservoir with the plurality of the anti-etching liquid cells and provide the anti-etching liquid.

9. The method according to claim 8, further including:
an insulation layer disposed between the anti-etching liquid reservoir and the plurality of liquid jet units to insulate the anti-etching liquid reservoir and the plurality of the liquid jet units; and
a plurality of openings formed in the insulation layer to connect the anti-etching liquid reservoir with the plurality of liquid jet units.

10. The method according to claim 1, wherein:
a plurality of liquid jet columns form a liquid jet group; and
a plurality of liquid jet groups form a liquid jet module.

11. The method according to claim 10, wherein:
a plurality of liquid jet modules in a line perpendicular to the scanning direction form a multiple-liquid jet module.

12. The method according to claim 10, wherein:
the plurality of liquid jet units in the liquid jet group are aligned into columns and rows;
the columns are perpendicular to the scanning direction; and
the rows have a predetermined angle with the scanning direction.

13. The method according to claim 1, wherein:
the plurality of exposure units are disposed between adjacent columns.

14. The method according to claim 1, wherein:
periodic distances of liquid jet units in different groups along the scanning direction are different.

15. The method according to claim 1, wherein jetting the anti-etching liquid onto the surface of the substrate further includes:
applying a voltage between the first electrode and the second electrode of the compression unit of the liquid jet unit to compress the anti-etching liquid cell.

16. The method according to claim 1, wherein:
a thickness of the first electrode is smaller than a thickness of the second electrode.

17. The method according to claim 1, further including:
the compression unit is made of a piezoelectric material or an electric thermal material.

18. The method according to claim 1, wherein:
in each column, the liquid jet units are arranged such that:
the jet nozzles are aligned along a central line of the column while adjacent two anti-etching liquid cells are located on opposite sides of the central line of the column.

* * * * *